(12) United States Patent
Wang et al.

(10) Patent No.: US 7,164,202 B2
(45) Date of Patent: Jan. 16, 2007

(54) QUAD FLAT FLIP CHIP PACKAGE AND LEADFRAME THEREOF

(75) Inventors: Hsueh-Te Wang, Kaohsiung (TW); Meng-Jen Wang, Pingtung (TW); Chien Liu, Kaohsiung (TW); Chi-Hao Chiu, Pingdung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/904,517

(22) Filed: Nov. 15, 2004

(65) Prior Publication Data

US 2005/0156296 A1   Jul. 21, 2005

(30) Foreign Application Priority Data

Jan. 2, 2004   (TW) .............................. 93100023 A

(51) Int. Cl.
*H01L 23/48*   (2006.01)

(52) U.S. Cl. ...................................... 257/737; 257/738
(58) Field of Classification Search ................ 257/673, 257/737, 738, 778
See application file for complete search history.

(56) References Cited

U.S. PATENT DOCUMENTS 6,011,300 A * 1/2000 Muramatsu .................. 257/668
6,864,423 B1 * 3/2005 Tan et al. ................... 174/52.2

* cited by examiner

*Primary Examiner*—Roy Potter
(74) *Attorney, Agent, or Firm*—Jianq Chyun IP Office

(57) ABSTRACT

A quad flat flip chip package and a leadframe therefor are provided. A bump connection part is defined by bending or etching the leads of the leadframe. Thus, the bump formed after a reflow process is limited within the bump connection part, and the collapse of the bump can be prevented. Moreover, and the manufacturing costs of the package can be decreased and the process thereof can be simplified.

13 Claims, 5 Drawing Sheets

QUAD FLAT FLIP CHIP PACKAGE AND LEADFRAME THEREOF

CROSS-REFERENCE TO RELATED APPLICATION

This application claims the priority benefit of Taiwan application serial no. 93100023, filed on Jan. 2, 2004.

BACKGROUND OF THE INVENTION

1. Field of the Invention

The present invention relates to a quad flat flip package and a leadframe thereof. More particularly, the present invention relates to a quad flat flip package and a leadframe for the quad flat flip package, which helps prevent bump-collapse.

2. Description of the Related Art

Semiconductor Industry is one of the most developed technology in recent years. With the technology advancing, the hi-tech electronics industries have developed thinner, lighter and more compact products with artificial intelligence and better functions. In the manufacturing process of semiconductor products, a leadframe is one of the most common elements in package. A quad flat package (QFP) can be divided as I-type (QFI), J-type (QFJ) and non-lead-type (QFN), according to the shape of the lead of leadframes. Since the QFP has relatively shorter signal traces and a faster speed for signal transmission, it has become the mainstream for the package with low pin count, and is suitable for the chip package with high-frequency (i.e. radio frequency) transmission.

FIG. 1 is a side view of a conventional quad flat non-lead flip chip package. FIG. 2 is a bottom view of the conventional quad flat non-lead flip chip package of FIG. 1.

Please refer to FIGS. 1 and 2. The conventional quad flat non-lead flip chip package 100 comprises a chip 110, a leadframe 120 and a molding compound material 130. The chip 110 has an active surface 112 and a corresponding backside surface 114. The active surface 112 refers to a surface having active elements. Further, bonding pads 116 are located on the active surface 112 of the chip 110. The bonding pads 116 are usually exposed through openings of a passivation layer (not shown).

The leadframe 120 includes a plurality of leads 122, and each of the leads 122 has a top surface 122a and a bottom surface 122b. The bonding pads 116 of the chip 110 are respectively connected with the top surface 122a of the leads 122 through bumps 140, such that the bonding pads 116 are electrically connected with the leads 122. The molding compound material 130 encapsulates the chip 110, bumps 140 and leads 122 and exposes the bottom surface 122b of each of the leads 122, as shown in FIG. 2.

Back to FIG. 1, in the conventional manufacturing process of a quad flat non-lead package, the bumps 140 connected with the bonding pads 116 are made of soft metal with a low melting point such as Sn63/Pb37 alloy. During a reflow process, since it is hard to control the wetting extent of the low-melting-point solder and sometimes the melted solder extends too far (i.e. wetting extent too larger), the bumps 140 may collapse. In order to solve this problem, it is known to use high lead bumps whose melting temperature is relatively high to replace the eutectic bump mentioned above. Because of the bondability between the top surface 122a of the leads 122 and the high lead bumps is poor, a solder paste 150 is required to be sprayed on the top surface 122a of the leads 122. However, the high lead bumps are more expensive, thus increasing the manufacturing costs. Also, because a solder paste is required for the high lead bumps, the manufacturing processes become more complicated.

SUMMARY OF THE INVENTION

According to one aspect of the present invention, it is to provide a quad flat flip chip package, wherein a bump connection part is defined by bending or etching the leads of the leadframe. Thus, the bumps are limited within the bump connection part during the reflow process, instead of wetting other portions of the leads. Hence, the collapse of the bumps can be prevented.

According to another aspect of the present invention, it is to provide a quad flat flip chip package, wherein a bump connection part is defined by bending or etching the leads of the leadframe for arranging bumps. Neither expensive high lead bumps nor a solder paste sprayed on the top surface of the leads is required. Thus, the manufacturing costs of the package can be decreased, and the process thereof can be simplified.

According to still another aspect of the present invention, it is to provide a leadframe for connecting a chip through a plurality of bumps, comprising: a plurality of leads, wherein each of the leads comprises a lead body, a bump connection part and a bump confining part for connecting the lead body and the bump connection part. The bump connection part comprises a bump connection surface. The bump confining part comprises a bump confining surface. An angle θ is between the bump connection surface connected with the bump confining surface and θ is equal to or less than 90 degrees.

According to yet another aspect of the present invention, it is to provide a quad flat flip chip package, comprising: a chip, a leadframe, a plurality of bumps and a molding compound material. The chip has an active surface and a corresponding backside surface, wherein a plurality of bonding pads are located on the active surface. The leadframe comprises a plurality of leads, wherein each of the leads includes a lead body, a bump connection part and a bump confining part for connecting the lead body and the bump connection part. The bump connection part has a bump connection surface. The bump confining part has a bump confining surface. An angle θ is between the bump connection surface connected with the bump confining surface, and θ is equal to or less than 90 degrees. The bumps are arranged between the bump connection surfaces and the bonding pads. The molding compound material encapsulates the chip, the leadframe and the bumps and exposes a portion of the leads.

Accordingly, in one embodiment of the present invention, the bump confining part is a trench. The extension direction of the trench differs from that of the lead body. The trench has sidewalls. Among the sidewalls, the one connected with the bump connection surface serves as the bump confining surface of the bump confining part. Moreover, the bump confining surface can be a curved surface or a flat surface, for example.

Accordingly, in one embodiment of the present invention, the bump confining part is bent in a clockwise direction towards the lead body to generate a height difference between the bump connection part and the lead body. The bump connection part is bent in a counterclockwise direction toward the bump confining part. Therefore an angle θ between the bump connection surface and the corresponding bump confining surface is formed, such that the bump connection part is distinguishable from other portion of the leads.

In one embodiment of the present invention, the leadframe further comprises a heat sink having a top surface and a bottom surface, wherein the heat sink is surrounded by the leads. The top surface of the heat sink is in contact with the active surface of the chip, and the bottom surface of the heat sink is exposed out of the molding compound material for dissipating the heat generated by the chip to the external environment.

According to the present invention, the bump connection part is defined by bending or etching the leads of the leadframe. Thus, the bump formed after a reflow process is limited within the bump confining connection part without wetting other portions of the leads, and the collapse of bumps can be prevented. Furthermore, since the bump connection part is defined in accordance with the present invention, instead of using high lead bumps with a solder paste as in the conventional bonding technology, the manufacturing costs of the package can be decreased and the process thereof can be simplified.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The following drawings illustrate embodiments of the invention and, together with the description, serve to explain the principles of the invention.

DESCRIPTION OF THE EMBODIMENTS

Figure 1:
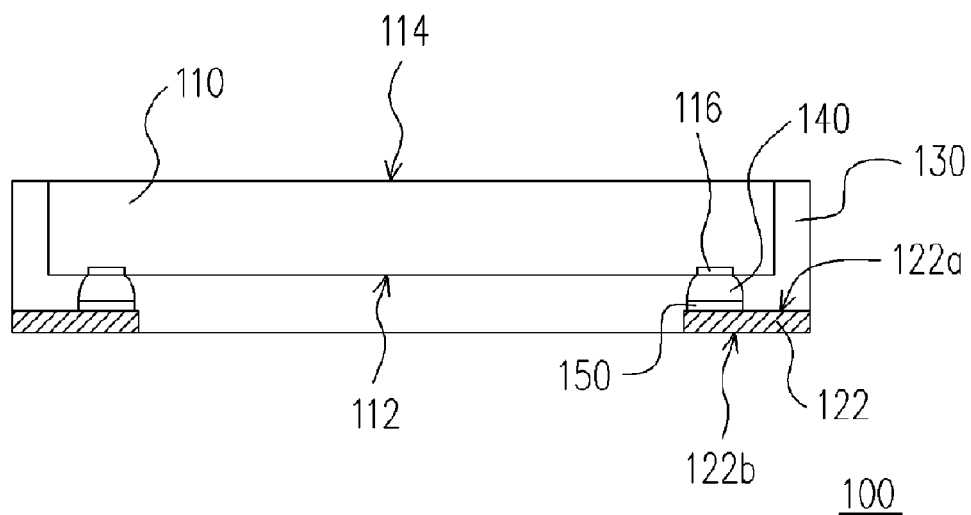
FIG. 1 is a side view of a conventional quad flat non-lead package.
Figure 2:
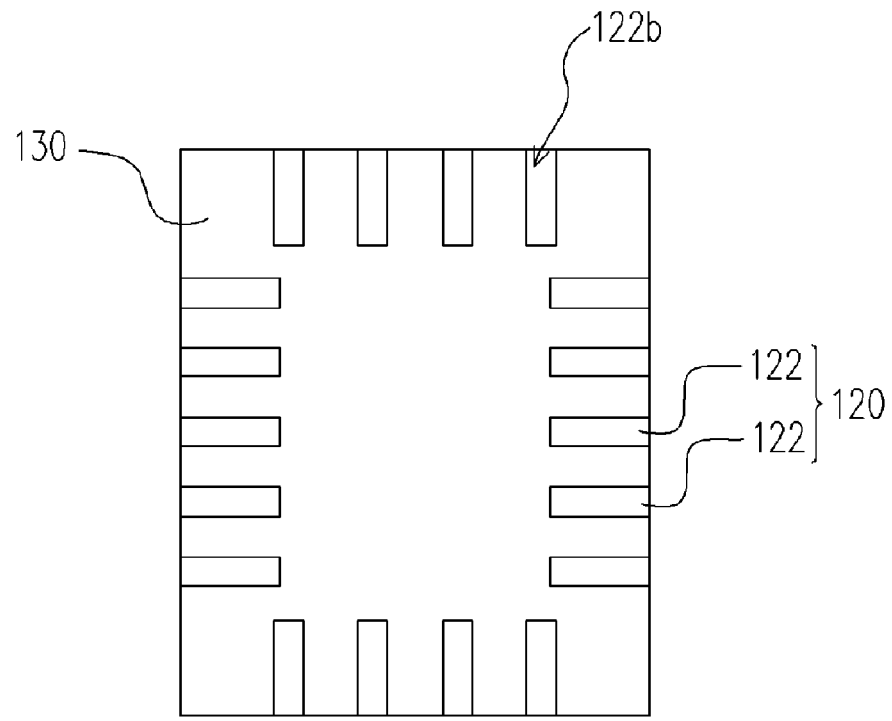
FIG. 2 is a bottom view of the conventional quad flat non-lead package of FIG. 1.
Figure 3:
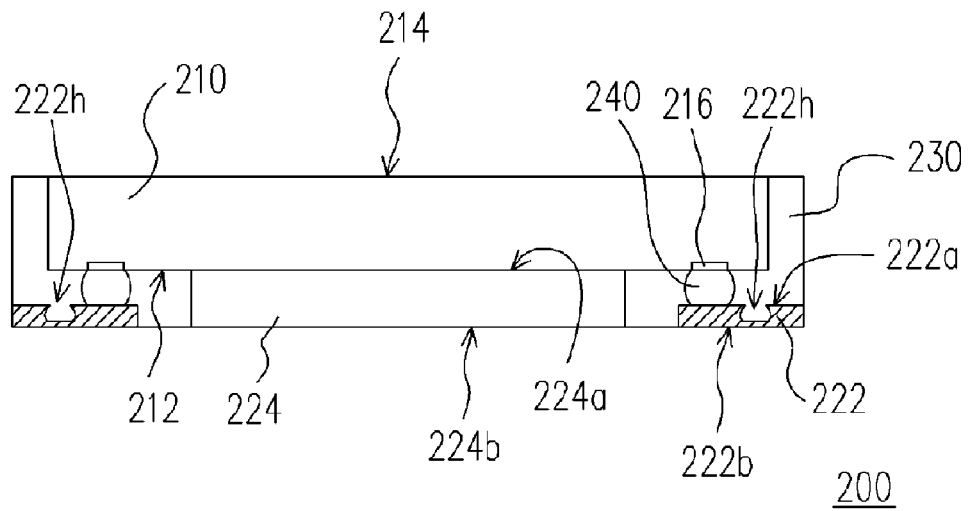
FIG. 3 is side view of a quad flat non-lead package according to a preferred embodiment of the present invention.
Figure 4:
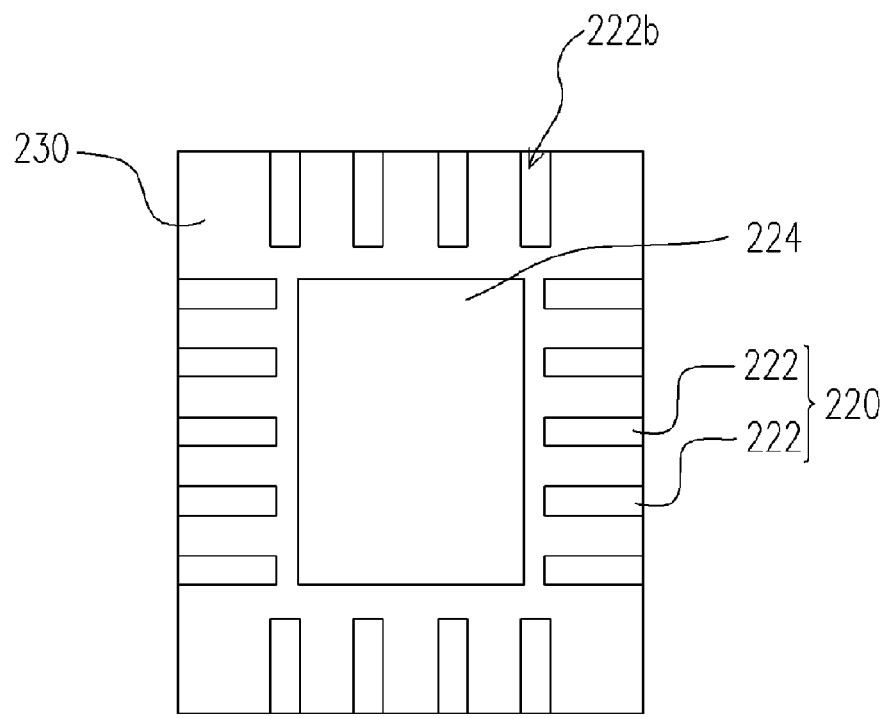
FIG. 4 is a bottom view of the quad flat non-lead package of FIG. 3.

FIG. 3 is side view of a quad flat non-lead package according to a preferred embodiment of the present invention. FIG. 4 is a bottom view of the quad flat non-lead package of FIG. 3. With reference to FIGS. 3 and 4, the quad flat flip chip package 200 of the present invention comprises a chip 210, a leadframe 220 and a molding compound material 230. The chip 210 has an active surface 212 and a corresponding backside surface 214. The active surface 212 refers to a surface having active elements. Further, a plurality of bonding pads 216 are located on the active surface 212 of the chip 210. The bonding pads 216 are usually exposed through openings of a passivation layer (not shown).

The leadframe 220 such as a quad flat type (see FIG. 3) includes a plurality of leads 222. Each of the leads 222 has a top surface 222a and a bottom surface 222b. The bonding pads 216 of the chip 210 are respectively connected with the top surface 222a of the leads 222 through bumps 240, such that the bonding pads 216 are electrically connected with the leads 222. The chip 210 and the leadframe 220 are connected in a flip chip manner.

The molding compound material 230 encapsulates the chip 210, bumps 240 and top surface 222a of the leads 222 and exposes the bottom surface 222b of each of the leads 222, as shown in FIG. 4. The chip 210 is protected from outside air or external force by encapsulating the chip 210, bumps 240 and top surfaces 222a of leads 222 with the molding compound material 230.

Moreover, the leadframe 220 includes a heat sink 224. The heat sink is surrounded by the leads 222 as shown in FIG. 4. The heat sink 224 includes a top surface 224a and a bottom surface 224b. It is preferred that the top surface 224a of the heat sink 224 is in contact with the active surface 212 of the chip 210, and the bottom surface 224b of the heat sink 224 is exposed by the molding compound material 230. Thus, the heat generated by the chip 210 can be dissipated through the heat sink 224 and the heat dissipation of the package is improved.

Figure 5A:
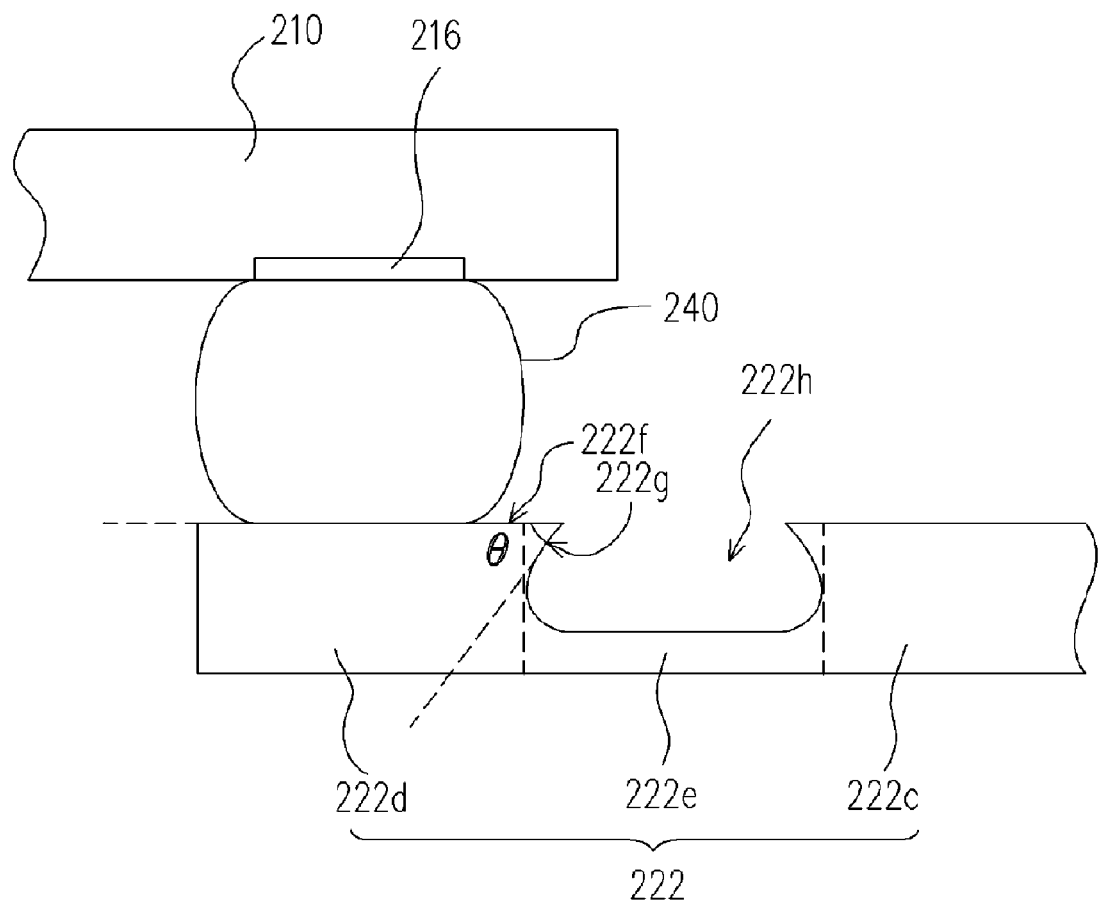
FIG. 5A is a cross-sectional view of leads of a quad flat non-lead package of the present invention.

FIG. 5A is a cross-sectional view of leads of a quad flat non-lead package of the present invention. With reference to FIG. 5A, each of the leads 222 of the leadframe 220 of the present invention comprises a lead body 222c, a bump connection part 222d and a bump confining part 222e for connecting the lead body 222c and the bump connection part 222d. Each of the bump connection parts 222d includes a bump connection surface 222f. Each of the bump confining parts 222e includes a bump confining surface 222g. The bump connection surface 222f is connected with the bump confining surface 222g with an angle θ therebetween, wherein θ is equal to or less then 90 degrees.

Figure 5B:
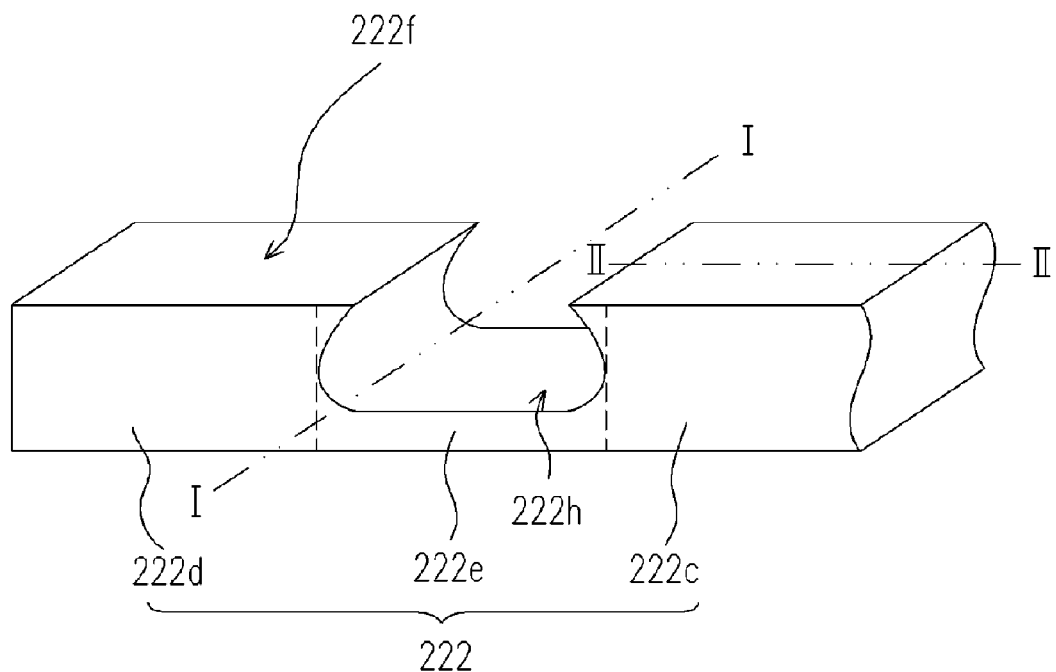
FIG. 5B is a perspective view of the leads of FIG. 5A.

FIG. 5B is a perspective view of the leads of FIG. 5A. In this embodiment, the bump confining part 222e is a cavity or trench 222h, for example. The trench 222h cuts cross the leads 222 transversely. The extension direction of the trench 222h is represented by the line I—I. The extension direction of the lead body 222c is the lengthwise direction of the lead body 222c and is represented by the line II—II. The extension direction of the trench 222h is different from that of the lead body 222c. For example, the extension direction of the trench 222h is perpendicular to that of the lead body 222c. The trench 222h has a plurality of sidewalls. Among the sidewalls, the sidewall connected with the bump connection surface 222f serves as the bump confining surface 222g of the bump confining part 222e. There is an angle θ formed between the bump confining surface 222g (the sidewall of the trench 222h connected with the bump connection surface 222f) and the connected bump connection surface 222f, and θ is equal to or less then 90 degrees. For example, the bump confining surface 222g can be a curved surface (see FIG. 5A) or a flat surface (not shown).

For example, in this embodiment, the trench 222h is formed by etching to define the bump connection part 222d. By setting the angle θ between the bump connection surface 222f and the bump confining surface 222g (i.e. the angle between the bump connection surface 222f and the wall of the trench 222h for connecting with the bump connection surface 222f) to be an acute angle (i.e. θ<90 degrees) or a right angle, the melt solder is limited within the bump connection part 222d without flowing to other portiond of the leads 222 (i.e. the lead body 222c) during a reflow process. Thus, the height of bumps 240 can be maintained and the bump collapse is prevented. The quality of electrically connection between the bumps 240 and leads 222 can be improved.

Furthermore, since a region for disposing the bump is defined by etching; neither costly high lead bumps nor a solder paste sprayed between the top surface of the leads and the high lead bumps is required. The manufacturing costs of the package can be decreased and the manufacturing process thereof can be simplified.

Figure 6:
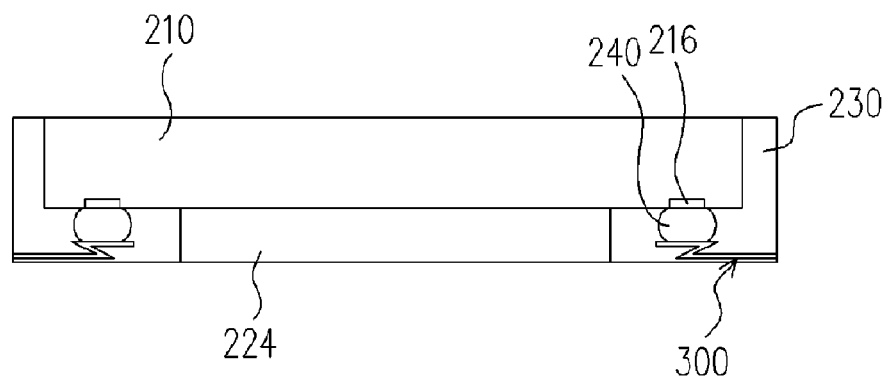
FIG. 6 is a side view of a quad flat non-lead package according to another preferred embodiment of the present invention.
Figure 7:
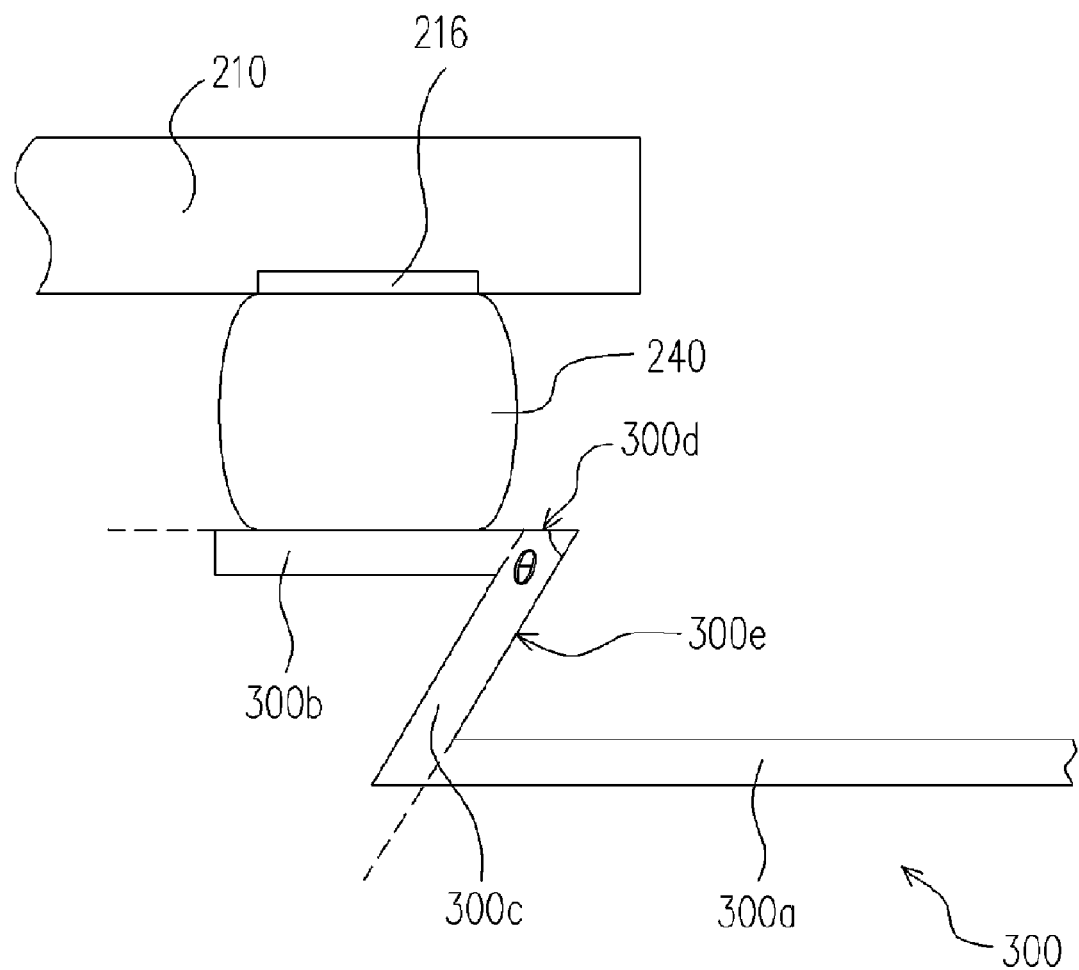
FIG. 7 is a cross-sectional view of leads of a quad flat non-lead package according to another preferred embodiment.

FIG. 6 is a side view of a quad flat non-lead package according to another preferred embodiment of the present invention. FIG. 7 is a cross-sectional view of leads of a quad flat non-lead package according to another preferred embodiment.

With reference to FIGS. 6 and 7, the quad flat flip chip package is substantially the same as the previous embodiment. The explanation for with the same portions of the structure is therefore omitted. The major difference between this embodiment and the previous one is that the leads 300 are improved. Each of the leads 300 comprises a lead body 300a, a bump connection part 300b and a bump confining part 300c for connecting the lead body 300a and the bump connection part 300b. Each of the bump connection parts 300b includes a bump connection surface 300d. Each of the bump confining parts 300c includes a bump confining surface 300e. The bump connection surface 300d is connected with the bump confining surface 300e, having an angle θ therebetween, and θ is equal to or less then 90 degrees. The bumps 240 are confined within the bump connection parts 300b. Through the bumps 240, the bonding pads 216 of the chip 210 are connected with the corresponding leads 300.

With reference to FIG. 7, the leads 300 of the leadframe are bent into 3 parts, i.e. the lead body 300a, the bump connection part 300b and the bump confining part 300c. In other words, the bump confining part 300c is bent in a clockwise direction towards the lead body 300a to generate a height difference between the bump connection part 300b and the lead body 300a. The bump connection part 300b is bent in an counterclockwise direction toward the bump confining part 300c. Therefore an angle θ is formed between the bump connection surface 300d of the bump connection part 300b and the bump confining surface 300e of the bump confining part 300c. The angle θ is set to be an acute angle or a right angle, such that the bump connection part 300b is defined and confined. The melt solder is confined within the bump connection part 300b without flowing to other portions of the leads 300 (i.e. the lead body 300a) during a reflow process, so that the bumps 240 formed after the reflow process are disposed within the bump connection parts 300b. Hence, and the bumps 240 are protected from being collapse and the height of the bumps 240 can be maintained.

According to the preferred embodiments of the present invention, the QFN package serves as an example. However, it is understood by persons skilled in art that the bump connection parts defined by bending or etching leads are not limited to apply to QFN package. The present invention can also be applied to quad flat packages with I-type (QFI) and J-type (QFJ).

Accordingly, the present invention has at least the following merits:

1. In the quad flat flip chip package and the leadframe therefor in the present invention, the bump connection parts are defined by bending or etching leads of the leadframe. Thus, the bumps formed after the reflow process can be confined within the bump connection parts without flowing or wetting other portions of leads, and the collapse of the bumps can be prevented.

2. In the quad flat flip chip package and the leadframe therefor in the present invention, the bump connection parts defined by bending or etching leads of the leadframe are provided for arranging bumps. Neither costly high lead bumps nor a solder paste sprayed on the top surface of the leads is required. A good bondability without wetting other portion of the leads can be achieved. Thus, the manufacturing costs can be reduced, and the manufacturing process can be simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A leadframe for connecting a chip through a plurality of bumps, comprising:
   a plurality of leads, wherein each of the leads comprises a lead body, a bump connection part and a bump confining part for connecting the lead body and the bump connection part,
   wherein the bump connection part comprises a bump connection surface, and the bump confining part comprises a bump confining surface, and the bump confining surface comprises a curved surface,
   wherein an angle θ is between the bump connection surface and the bump confining surface, and θ is equal to or less than 90 degrees.

2. The leadframe of claim 1, wherein each of the bump confining part is a trench, and an extension direction of the trench differs from an extension direction of the lead body, and a sidewall of the trench serves as the bump confining surface of the bump confining part.

3. The leadframe of claim 2, wherein the bump confining surface comprises a flat surface.

4. The leadframe of claim 1, wherein there is a height difference between the bump connection part and the lead body.

5. The leadframe of claim 1, further comprising a heat sink surrounded by the leads.

6. A quad flat flip chip package, comprising:
   a chip having an active surface and a corresponding backside surface, wherein a plurality of bonding pads are located on the active surface;
   a leadframe, comprising a plurality of leads, wherein each of the leads including a lead body, a bump connection part and a bump confining part for connecting the lead body and the bump connection part, and the bump connection part has a bump connection surface, and the bump confining part has a bump confining surface, and the bump confining surface comprises a curved surface, and wherein an angle θ is between the bump connection surface that is connected with the bump confining surface, and θ is equal to or less than 90 degrees;
   a plurality of bumps, arranged between the bump connection surfaces and the bonding pads; and
   a molding compound material, encapsulating the chip, the leadframe and the bumps and exposing a portion of the leads.

7. The quad flat flip chip package of claim 6, wherein the bump confining part is a trench, and an extension direction of the trench differs from an extension direction of the lead body, and a sidewall of the trench for connecting the bump connection surface serves as the bump confining surface of the bump confining part.

8. The quad flat flip chip package of claim 7, wherein the bump confining surface comprises a flat surface.

9. The quad flat flip chip package of claim 6, wherein there is a height difference between the bump connection part and the lead body.

10. The quad flat flip chip package of claim 6, further comprising a heat sink having a top surface and a bottom surface, wherein the heat sink is surrounded by the leads.

11. The quad flat flip chip package of claim 10, wherein the bottom surface of the heat sink is exposed from the molding compound material.

12. The quad flat flip chip package of claim 10, wherein the top surface of the heat sink is in contact with the active surface of the chip.

13. The quad flat flip chip package of claim 6, wherein each of the leads has a bottom surface exposed from the molding compound material.

* * * * *